United States Patent
Simkowiak

(10) Patent No.: US 12,347,889 B2
(45) Date of Patent: Jul. 1, 2025

(54) LEAF SPRING CONNECTOR FOR LITHIUM-ION BATTERY CELLS

(71) Applicant: Derek Simkowiak, Lynnwood, WA (US)

(72) Inventor: Derek Simkowiak, Lynnwood, WA (US)

(73) Assignee: HOLDING ZERO, LLC, Albuquerque, NM (US)

( * ) Notice: Subject to any disclaimer, the term of this patent is extended or adjusted under 35 U.S.C. 154(b) by 226 days.

(21) Appl. No.: 18/349,737

(22) Filed: Jul. 10, 2023

(65) Prior Publication Data

US 2024/0014515 A1    Jan. 11, 2024

Related U.S. Application Data

(60) Provisional application No. 63/359,252, filed on Jul. 8, 2022.

(51) Int. Cl.
| | |
|---|---|
| *H01M 50/50* | (2021.01) |
| *H01M 10/0525* | (2010.01) |
| *H05K 1/18* | (2006.01) |
| *H05K 3/30* | (2006.01) |

(52) U.S. Cl.
CPC ........... *H01M 50/50* (2021.01); *H05K 1/181* (2013.01); *H05K 1/184* (2013.01); *H05K 3/308* (2013.01); *H01M 10/0525* (2013.01); *H05K 2201/10757* (2013.01); *H05K 2201/10909* (2013.01)

(58) Field of Classification Search
CPC ............................ H01M 50/50; H01M 50/503; H01R 13/2442; H01R 43/16
See application file for complete search history.

(56) References Cited

U.S. PATENT DOCUMENTS

| | | | | |
|---|---|---|---|---|
| 5,250,371 | A | * 10/1993 | Kleinert, III | H05K 3/325 |
| | | | | 455/343.1 |
| 2011/0104958 | A1 | * 5/2011 | Kwon | H01R 13/2464 |
| | | | | 439/816 |
| 2015/0380713 | A1 | * 12/2015 | Kimura | H01H 37/32 |
| | | | | 429/121 |

FOREIGN PATENT DOCUMENTS

| | | | | |
|---|---|---|---|---|
| KR | 20240036256 A | * | 3/2024 | .......... H01M 50/503 |
| WO | WO-2020164692 A1 | * | 8/2020 | ............ H01M 10/48 |

* cited by examiner

*Primary Examiner* — Nathan Milakovich

(74) *Attorney, Agent, or Firm* — Kameron W. Kramer

(57) ABSTRACT

The present disclosure describes a non-welded leaf spring battery cell connector which allows for unrestricted outgassing during Lithium-Ion thermal runaway. The connector also has a low-resistance electrical connection surface for applications with rough, uneven contact surfaces such as those on refurbished Lithium-Ion battery cells. The connector is compatible with both protected and unprotected Lithium-Ion cells, as it allows for up to about 5 mm of vertical travel to support varying battery cell lengths caused by battery protection circuits. The leaf spring connector for Lithium-Ion battery cells is made of a conductive sheet of metal, cut and folded into a leaf-spring connector for a removable, non-welded battery cell. The leaf spring connector has one or more areas of material removed, as to not block the flow of caustic gasses during emergency outgassing.

10 Claims, 2 Drawing Sheets

LEAF SPRING CONNECTOR FOR LITHIUM-ION BATTERY CELLS

CROSS-REFERENCE TO RELATED APPLICATIONS

This application claims the benefit of U.S. Provisional Patent Application Ser. No. 63/359,252 filed Jul. 8, 2022, titled "LEAF SPRING CONNECTOR FOR LITHIUM-ION BATTERY CELLS," and the subject matter thereof is incorporated herein by reference thereto.

TECHNICAL FIELD

The present disclosure relates to a connector for battery cells. More particularly, the present disclosure relates to structural and electrical aspects of a leaf spring connector for Lithium-Ion battery cells.

BACKGROUND ART

The present disclosure describes a leaf spring connector for Lithium-Ion battery cells for applications in which there is a risk of the Lithium-Ion based batteries to catch fire, due to thermal runaway.

As a safety control mechanism, Lithium-Ion battery cells are designed with weak physical failure points in the top end of the battery. If the cell enters thermal runaway, the resulting dangerous, hot, poisonous, pressurized caustic gasses will be directed out along the length of the cell so they can be properly ventilated to prevent a pressurized explosion. A Lithium-Ion cell connector must allow for this failure mode and not restrict the designed ventilation path for the emergency outgassing.

Additionally, refurbished Lithium-Ion battery cells commonly have sharp, rough, and uneven spurs of welded metal and solder remaining on the round anode and cathode ends of the cell due to mechanical disconnection of welded sheet metal from the battery cell's anode or cathode. These sharp, rough, uneven surfaces result in small electrical contact planes, which cause excessive heat generation due to electrical resistance.

Finally, although the model id of a Lithium-Ion battery cell (such as 18650, 20700, or 21700) defines the nominal length of the unpackaged cell in millimeters (mm), protected cells can be up to about 3 mm longer than nominal due to the addition of a Lithium-Ion protection circuit, which is an add-on safety device which disconnects the battery if it is used unsafely with too much current, voltage, or heat. To be compatible with both protected and unprotected Lithium-Ion cells, a Lithium-Ion cell connector must have a minimum of about 3 mm total spring travel distance between each end of the battery. Thus, an improved a leaf spring connector for Lithium-Ion battery cells is required which reduces or removes one or more of the issues mentioned.

None of the prior art fully addresses the problems resolved by the present invention. The present invention overcomes these limitations contained in the prior art.

Certain embodiments of the invention have other steps or elements in addition to or in place of those mentioned above. The steps or element will become apparent to those skilled in the art from a reading of the following detailed description when taken with reference to the accompanying figures, if any.

DETAILED DESCRIPTION OF THE INVENTION

Figure 1:
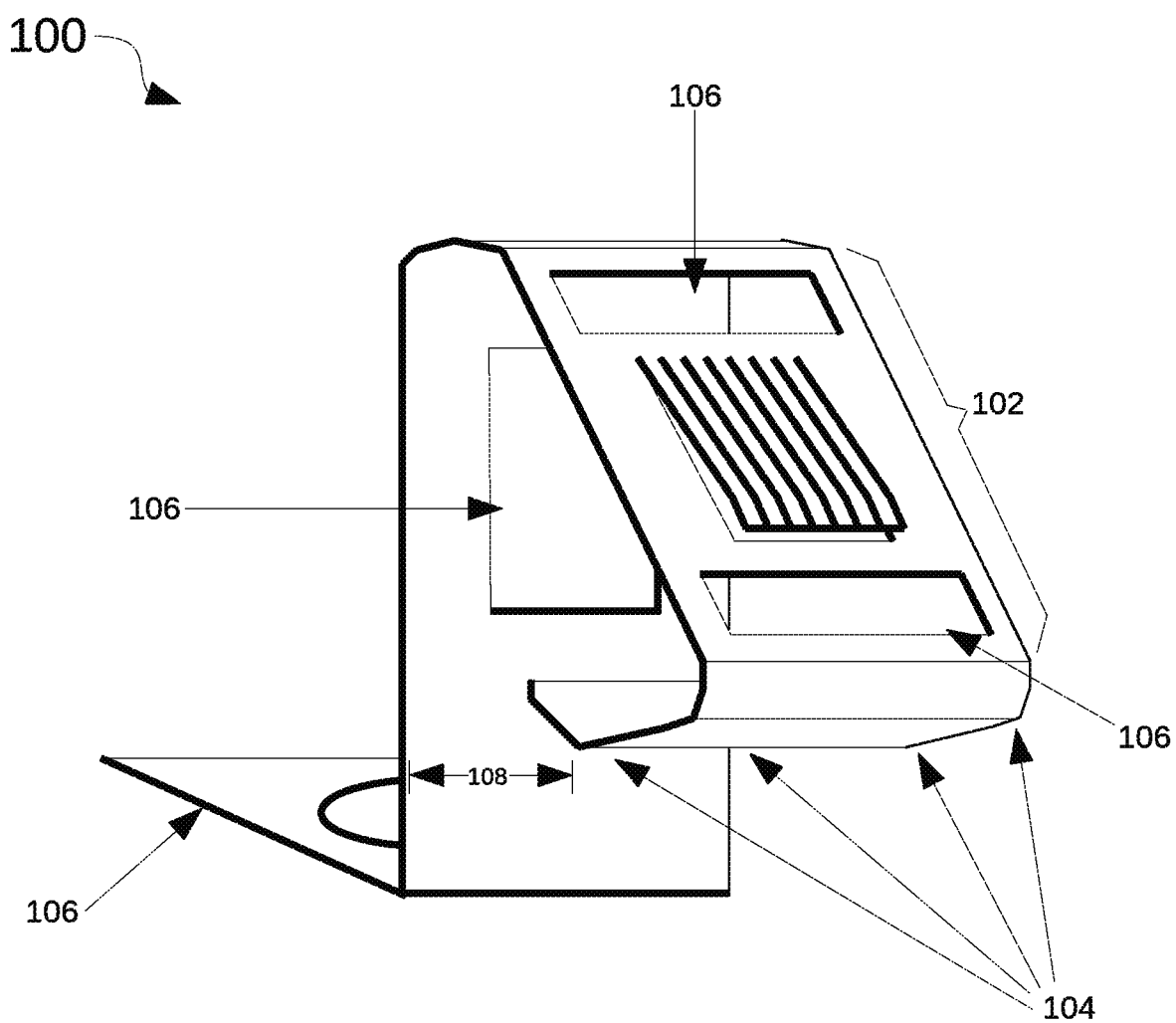
FIG. 1 illustrates a perspective view of the leaf spring connector for Lithium-Ion battery cells, according to certain embodiments of the invention.

The best mode for carrying out the invention will be described herein. The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. To avoid obscuring the present invention, some well-known system configurations, and process steps are not disclosed in detail. The figures illustrating embodiments of the system, if any, are semi-diagrammatic and not to scale and, particularly, some of the dimensions are for the clarity of presentation and are shown exaggerated in the drawing figures.

Alternate embodiments have been included throughout, and the order of such are not intended to have any other significance or provide limitations for the present invention.

For expository purposes, the term "horizontal" as used herein is defined as a plane parallel to the plane or surface of the present apparatus, regardless of its orientation. The term "vertical" refers to a direction perpendicular to the horizontal as just defined. Terms, such as "above", "below", "bottom", "top", "side", "higher", "lower", "upper", "over", and "under", are defined with respect to the horizontal plane, as shown in the figures, if any. The term "on" means that there is direct contact among elements.

The words "including", "comprising", "incorporating", "consisting of", "have", and "is" are meant to be non-exclusive, meaning additional items, components or elements may be present. Joinder references such as "connected", "connecting", and "coupled" do not limit the position, orientation, or use of systems and/or methods, and do not necessarily infer that two elements are directly connected. All identifying numerical terms are for identification only, and do not refer to the order or preference of any element, embodiment, variation and/or modification.

The present disclosure provides a leaf spring connector for lithium-ion battery cells comprising conductive sheet metal folded into a leaf-spring battery connector; areas of material removed such that battery cell outgas sing is not blocked during operation; a header lip fold to maintain a ventilation path for outgassing; a maximum spring travel distance to ensure a ventilation path for outgassing; and a minimum spring travel distance to accommodate varying cell lengths.

The present disclosure further provides a method of assembling a leaf spring connector for lithium-ion battery cells, the method comprising cutting a connector template form from sheet metal; and forming a connector template form into a leaf spring shape.

The present disclosure provides a non-welded leaf spring battery cell connector which allows for unrestricted outgassing during Lithium-Ion thermal runaway. The connector also has a low-resistance electrical connection surface for applications with rough, uneven contact surfaces such as those on refurbished Lithium-Ion battery cells. The connector is compatible with both protected and unprotected Lithium-Ion cells, as it allows for up to 5 mm of vertical travel to support varying battery cell lengths caused by battery protection circuits.

The leaf spring connector for Lithium-Ion battery cells is made of a conductive sheet of metal, cut and folded into a leaf-spring connector for a removable, non-welded battery cell. The leaf spring connector has one or more areas of material removed, as to not block the flow of caustic gasses during emergency outgassing. The leaf spring includes a header lip fold that acts as a backstop to prevent the battery cell from being forced fully against the backing surface and to maintain a minimum of about 1 mm clearance on the anode connection surface for emergency outgassing.

Details to specific aspects or features of the present inventions are described below. Certain examples are illustrated in the accompanying drawings. Corresponding reference numbers will be used throughout the drawings to refer to the same or corresponding parts.

FIG. 1 illustrates a perspective view of the leaf spring connector for Lithium-Ion battery cells 100, according to certain embodiments of the invention. The preferred embodiment includes a primary connection surface 102 in a brush style, including vertical cuts and additional folds in the primary connection surface 102, which each have independent suspension travel along the length of the battery cell. In another embodiment, primary connection surface 102 is a round, circular style, including independently suspended contact points tracing a circle. In another embodiment, the primary connection surface 102 is flat. Other embodiments are also possible.

The preferred embodiment has a leaf spring shape with a minimum of about 3 mm of travel along the length of the battery, to accommodate both protected and unprotected Lithium-Ion batteries of a given cell model identifier. In another embodiment, a leaf spring shape with a minimum of about 1.5 mm of travel along the length of the battery cell, to accommodate both protected and unprotected Lithium-Ion batteries of a given model identifier, when both ends of the battery have at least about 1.5 mm of travel along the length of the battery cell for a total of at least about 3 mm variation in the supported battery length. When in operation, the header lip fold 104 prevents the leaf spring connector from clamping shut, and thus blocking the path of emergency outgassing, and the areas of material removed 106 prevents the leaf spring connector for Lithium-Ion battery cells 100 from blocking the path of emergency outgas sing.

The preferred embodiment has a gold electroplated primary connection surface 102, for increased electrical connectivity on rough anode or cathode connection points. In other embodiments, nickel electroplating may be used. Other primary connection surface 102 embodiments are also possible. In some embodiments, the primary connection surface 102 may include electrically conductive grease.

In the preferred embodiment, the connector lead 110 is suitable for through-hole reflow (THR) mounting on a printed circuit board (PCB), as would be known to those of skill in the art. In another embodiment, the connector lead 110 is suitable for surface-mount technology (SMT) mounting, as would be known to those of skill in the art. In other embodiments, the connector lead 110 may be a wire. Other connector lead 110 embodiments are also possible.

Figure 2:
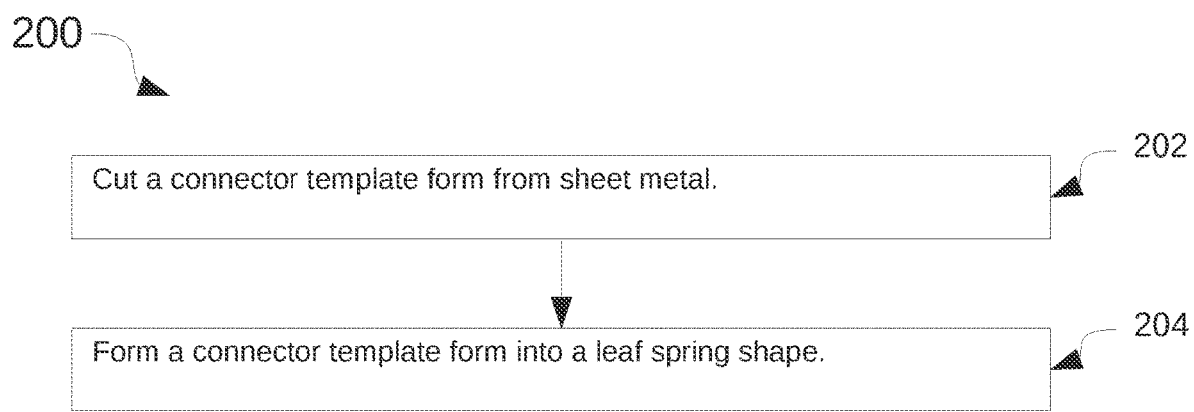
FIG. 2 illustrates a method of assembling a leaf spring connector for Lithium-Ion battery cells, according to certain embodiments of the invention.

FIG. 2 illustrates a method of assembling a leaf spring connector for Lithium-Ion battery cells 100, according to certain embodiments of the invention. According to method 200, at step 202 a connector template form is cut from sheet metal. For example, a mechanical sheet metal stamping die may be used to stamp out a bendable shape, as would be known to those of skill in the art.

According to method 200, at step 204 a connector template form is formed into a leaf spring shape. For example, a mechanical sheet metal stamping die may be used to process and bend sheet metal into a leaf spring shape, as would be known to those of skill in the art.

The best mode for carrying out the invention has been described herein. The previous embodiments are described in sufficient detail to enable those skilled in the art to make and use the invention. It is to be understood that other embodiments would be evident based on the present disclosure, and that system, process, or mechanical changes may be made without departing from the scope of the present invention.

In the previous description, numerous specific details and examples are given to provide a thorough understanding of the invention. However, it will be apparent that the invention may be practiced without these specific details and specific examples. While the invention has been described in conjunction with a specific best mode, it is to be understood that many alternatives, modifications, and variations will be apparent to those skilled in the art in light of the foregoing description. Accordingly, it is intended to embrace all such alternatives, modifications, and variations that fall within the scope of the included claims. All matters previously set forth herein or shown in the accompanying figures are to be interpreted in an illustrative and non-limiting sense.

LIST OF ELEMENTS SHOWN ON THE DRAWINGS 100 leaf spring connector for Lithium-Ion battery cells
102 primary connection surface
104 header lip fold
106 areas of material removed
108 spring travel
110 connector lead
200 Method
202 Step
204 Step

What is claimed is:

1. A leaf spring connector for lithium-ion battery cells comprising:
   conductive sheet metal folded into a leaf-spring battery connector;
   areas of material removed such that battery cell outgassing is not blocked during operation;
   a header lip fold to maintain a ventilation path for outgassing;
   a maximum spring travel distance to ensure a ventilation path for outgassing; and
   a minimum spring travel distance to accommodate varying cell lengths.

2. The leaf spring connector for lithium-ion battery cells of claim 1, wherein a primary connection surface is a brush style surface, including vertical cuts and additional folds in the primary connection surface.

3. The leaf spring connector for lithium-ion battery cells of claim 1, wherein a primary connection surface is a circular style surface, including independently suspended contact points tracing a circle.

4. The leaf spring connector for lithium-ion battery cells of claim 1, wherein the minimum spring travel distance is about 1.5 mm.

5. The leaf spring connector for lithium-ion battery cells of claim 1, wherein the minimum spring travel distance is about 3.0 mm.

6. The leaf spring connector for lithium-ion battery cells of claim 1, further comprising electroplated gold on a primary connection surface.

7. The leaf spring connector for lithium-ion battery cells of claim 1, further comprising electroplated nickel on a primary connection surface.

8. The leaf spring connector for lithium-ion battery cells of claim 1, further comprising a connector lead suitable for through-hole reflow mounting on a printed circuit board.

9. The leaf spring connector for lithium-ion battery cells of claim 1, further comprising a connector lead suitable for surface-mount technology mounting on a printed circuit board.

10. A method of assembling a leaf spring connector for lithium-ion battery cells, the method comprising:
  cutting a connector template form from sheet metal; and
  forming the connector template form into a leaf spring shape.

* * * * *